United States Patent
Roozeboom et al.

(10) Patent No.: US 9,761,458 B2
(45) Date of Patent: Sep. 12, 2017

(54) APPARATUS AND METHOD FOR REACTIVE ION ETCHING

(75) Inventors: Freddy Roozeboom, Waalre (NL); Adriaan Marinus Lankhorst, Oirschot (NL); Paulus Willibrordus George Poodt, Nijmegen (NL); Norbertus Benedictus Koster, Delft (NL); Gerardus Johan Jozef Winands, Eindhoven (NL); Adrianus Johannes Petrus Maria Vermeer, Geldrop (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 275 days.

(21) Appl. No.: 13/581,093

(22) PCT Filed: Feb. 25, 2011

(86) PCT No.: PCT/NL2011/050138
§ 371 (c)(1),
(2), (4) Date: Oct. 15, 2012

(87) PCT Pub. No.: WO2011/105908
PCT Pub. Date: Sep. 1, 2011

(65) Prior Publication Data
US 2013/0118895 A1    May 16, 2013

(30) Foreign Application Priority Data
Feb. 26, 2010 (EP) .................... 10154955
Mar. 1, 2010 (EP) .................... 10155103

(51) Int. Cl.
*C23C 14/00*    (2006.01)
*H01L 21/3065*    (2006.01)
(Continued)

(52) U.S. Cl.
CPC ...... *H01L 21/3065* (2013.01); *C23C 16/0245* (2013.01); *C23C 16/45525* (2013.01);
(Continued)

(58) Field of Classification Search
None
See application file for complete search history.

(56) References Cited

U.S. PATENT DOCUMENTS 2,782,090 A    2/1957    Robbart et al.
3,775,121 A    11/1973    Sharp
(Continued)

FOREIGN PATENT DOCUMENTS

CN    1474882 A    2/2004
CN    1507503 A    6/2004
(Continued)

OTHER PUBLICATIONS

International Search Report—PCT/NL2011/050112—Mailing date: May 26, 2011.
(Continued)

*Primary Examiner* — Timon Wanga
(74) *Attorney, Agent, or Firm* — Banner & Witcoff, Ltd.

(57) ABSTRACT

The invention relates to an apparatus for reactive ion etching of a substrate, comprising: a plasma etch zone including an etch gas supply and arranged with a plasma generating structure for igniting a plasma and comprising an electrode structure arranged to accelerate the etch plasma toward a substrate portion to have ions impinge on the surface of the substrate; a passivation zone including a cavity provided with a passivation gas supply; said supply arranged for providing a passivation gas flow from the supply to the cavity; the cavity in use being bounded by the injector head and the substrate surface; and a gas purge structure comprising a gas exhaust arranged between said etch zone and
(Continued)

passivation zone; the gas purge structure thus forming a spatial division of the etch and passivation zones.

16 Claims, 10 Drawing Sheets

(51) Int. Cl.
    *C23C 16/02*     (2006.01)
    *C23C 16/455*     (2006.01)
    *H01J 37/32*     (2006.01)
    *H01L 21/67*     (2006.01)

(52) U.S. Cl.
    CPC .... *H01J 37/3244* (2013.01); *H01J 37/32366* (2013.01); *H01J 37/32449* (2013.01); *H01J 37/32623* (2013.01); *H01J 37/32706* (2013.01); *H01L 21/30655* (2013.01); *H01L 21/67028* (2013.01); *H01J 2237/3341* (2013.01)

(56) References Cited

U.S. PATENT DOCUMENTS

| | | | |
|---|---|---|---|
| 4,389,973 A | 6/1983 | Suntola et al. | |
| 4,587,002 A | 5/1986 | Bok | |
| 4,628,238 A | 12/1986 | Smulders et al. | |
| 4,718,972 A | 1/1988 | Babu et al. | |
| 4,740,451 A | 4/1988 | Kohara | |
| 5,063,951 A | 11/1991 | Bard et al. | |
| 5,157,851 A | 10/1992 | Younan | |
| 5,443,861 A | 8/1995 | Huhne | |
| 5,641,608 A | 6/1997 | Grunwald et al. | |
| 5,993,916 A | 11/1999 | Zhao et al. | |
| 5,997,963 A | 12/1999 | Davison et al. | |
| 6,010,603 A * | 1/2000 | Ye et al. | 204/192.35 |
| 6,200,893 B1 | 3/2001 | Sneh | |
| 6,225,975 B1 | 5/2001 | Furuki et al. | |
| 6,255,039 B1 | 7/2001 | Xu et al. | |
| 6,270,617 B1 * | 8/2001 | Yin et al. | 156/345.48 |
| 6,451,695 B2 | 9/2002 | Sneh | |
| 6,475,910 B1 | 11/2002 | Sneh | |
| 6,495,233 B1 | 12/2002 | Shmurun et al. | |
| 6,547,978 B2 * | 4/2003 | Ye et al. | 216/75 |
| 6,582,767 B1 | 6/2003 | Fukushima et al. | |
| 6,602,784 B2 | 8/2003 | Sneh | |
| 6,630,401 B2 | 10/2003 | Sneh | |
| 6,638,862 B2 | 10/2003 | Sneh | |
| 6,641,673 B2 | 11/2003 | Yang | |
| 7,552,521 B2 | 6/2009 | Fink | |
| 7,572,686 B2 | 8/2009 | Levy et al. | |
| 7,850,780 B2 | 12/2010 | Levy et al. | |
| 8,110,254 B1 | 2/2012 | Sharma et al. | |
| 8,182,608 B2 | 5/2012 | Kerr et al. | |
| 8,303,713 B2 | 11/2012 | Belousov et al. | |
| 8,398,770 B2 | 3/2013 | Levy et al. | |
| 8,420,168 B2 | 4/2013 | Kerr et al. | |
| 2001/0010112 A1 | 8/2001 | Maeda | |
| 2002/0069826 A1 | 6/2002 | Hunt et al. | |
| 2002/0069827 A1 | 6/2002 | Sakamoto et al. | |
| 2004/0050685 A1 | 3/2004 | Yara et al. | |
| 2004/0052972 A1 | 3/2004 | Schmitt | |
| 2004/0058071 A1 | 3/2004 | Galasco et al. | |
| 2004/0058293 A1 * | 3/2004 | Nguyen et al. | 432/129 |
| 2004/0112537 A1 | 6/2004 | Yamazaki et al. | |
| 2004/0129220 A1 | 7/2004 | Saitoh et al. | |
| 2005/0011441 A1 | 1/2005 | Kannan | |
| 2005/0011752 A1 | 1/2005 | Yamazaki et al. | |
| 2005/0227049 A1 | 10/2005 | Boyack et al. | |
| 2006/0130761 A1 | 6/2006 | Sakai | |
| 2006/0166132 A1 | 7/2006 | Meagley | |
| 2006/0177579 A1 | 8/2006 | Shin et al. | |
| 2007/0139304 A1 | 6/2007 | Iwami et al. | |
| 2007/0218702 A1 | 9/2007 | Shimizu et al. | |
| 2007/0228470 A1 | 10/2007 | Levy | |
| 2007/0238311 A1 | 10/2007 | Levy | |
| 2007/0281089 A1 | 12/2007 | Heller et al. | |
| 2008/0075858 A1 | 3/2008 | Koh | |
| 2008/0166884 A1 | 7/2008 | Nelson | |
| 2008/0214012 A1 | 9/2008 | Park et al. | |
| 2008/0226838 A1 | 9/2008 | Nishimura et al. | |
| 2008/0260963 A1 | 10/2008 | Yoon et al. | |
| 2009/0078204 A1 | 3/2009 | Kerr et al. | |
| 2009/0081366 A1 | 3/2009 | Kerr et al. | |
| 2009/0081374 A1 | 3/2009 | Yang et al. | |
| 2009/0081827 A1 | 3/2009 | Yang et al. | |
| 2009/0081842 A1 | 3/2009 | Nelson et al. | |
| 2009/0081885 A1 | 3/2009 | Levy et al. | |
| 2009/0081886 A1 | 3/2009 | Levy et al. | |
| 2009/0155488 A1 | 6/2009 | Nakano et al. | |
| 2009/0165715 A1 | 7/2009 | Oh | |
| 2009/0217878 A1 | 9/2009 | Levy et al. | |
| 2009/0291209 A1 | 11/2009 | Granneman et al. | |
| 2010/0055317 A1 | 3/2010 | Kato et al. | |
| 2010/0173494 A1 | 7/2010 | Kobrin | |
| 2010/0248423 A1 | 9/2010 | Nelson et al. | |
| 2010/0258968 A1 | 10/2010 | Zu | |
| 2011/0005681 A1 | 1/2011 | Savas et al. | |
| 2011/0005682 A1 | 1/2011 | Savas et al. | |
| 2011/0006040 A1 | 1/2011 | Savas et al. | |
| 2011/0097494 A1 | 4/2011 | Kerr et al. | |
| 2011/0124199 A1 | 5/2011 | Granneman et al. | |
| 2011/0268879 A1 | 11/2011 | Granneman et al. | |
| 2011/0292622 A1 | 12/2011 | Hovestad et al. | |
| 2012/0003396 A1 | 1/2012 | Maas et al. | |
| 2012/0291707 A1 | 11/2012 | Granneman | |
| 2013/0043212 A1 | 2/2013 | De Graaf et al. | |
| 2013/0052347 A1 | 2/2013 | Kuznetsov et al. | |

FOREIGN PATENT DOCUMENTS

| | | |
|---|---|---|
| CN | 101207067 A | 6/2008 |
| CN | 101463473 A | 6/2009 |
| DE | 102004015216 B4 | 7/2006 |
| EP | 260097 A1 | 3/1988 |
| EP | 0370542 A1 | 5/1990 |
| EP | 0490118 A1 | 6/1992 |
| EP | 588242 A1 | 3/1994 |
| EP | 1340838 A1 | 9/2003 |
| EP | 1496138 A1 | 1/2005 |
| EP | 1592053 A1 | 11/2005 |
| EP | 2159304 A1 | 3/2010 |
| EP | 2211369 A1 | 7/2010 |
| GB | 0588242 A | 5/1947 |
| GB | 1023897 A | 3/1966 |
| GB | 1114782 A | 5/1968 |
| JP | H0659448 A | 3/1994 |
| JP | H0762232 A | 3/1995 |
| JP | H07286899 A | 10/1995 |
| JP | H08167666 A | 6/1996 |
| JP | H08228068 A | 9/1996 |
| JP | H10258181 A | 9/1998 |
| JP | H10274853 A | 10/1998 |
| JP | 3254179 B2 | 2/2002 |
| JP | 2002151494 A | 5/2002 |
| JP | 2003086516 A | 3/2003 |
| JP | 3411241 B2 | 5/2003 |
| JP | 2004111948 A | 4/2004 |
| JP | 2004349358 A | 12/2004 |
| JP | 2005050965 A | 2/2005 |
| JP | 2006167696 A | 6/2006 |
| JP | 2008085009 A | 4/2008 |
| JP | 2012511828 A | 5/2012 |
| JP | 5021932 B2 | 9/2012 |
| RU | 2041164 C1 | 8/1995 |
| RU | 2208658 C2 | 7/2003 |
| RU | 2264266 C1 | 11/2005 |
| RU | 2291223 C2 | 1/2007 |
| SU | 772601 A1 | 10/1980 |
| TW | 200926299 A | 6/2009 |
| WO | 00/42632 A1 | 7/2000 |
| WO | 0183852 A1 | 11/2001 |
| WO | 2004/012235 A2 | 2/2004 |
| WO | 2007106076 A2 | 9/2007 |

(56) References Cited

FOREIGN PATENT DOCUMENTS

| WO | 2008/027215 A2 | 3/2008 |
|---|---|---|
| WO | 2008027215 A2 | 3/2008 |
| WO | 2008085474 A2 | 7/2008 |
| WO | 2009017322 A1 | 2/2009 |
| WO | 2009142487 A1 | 11/2009 |
| WO | 2009142488 A1 | 11/2009 |
| WO | 2011006018 A2 | 1/2011 |
| WO | 2011041255 A1 | 4/2011 |
| WO | 2011/053446 A1 | 5/2011 |

OTHER PUBLICATIONS

Xirong Jiang et al, Area-Selective ALD with Soft Lithographic Methods: Using Self-Assembled Monolayers to Direct Film Deposition, Department of Physics, and Department of Chemical Engineering, Stanford UniVersity, 2009 American Chemical Society Published on Web Sep. 3, 2009.

Hiroyuki Sugimura et al, Photolithography based on organosilane self-assembled monolayer resist, Department of Materials Processing Engineering, Graduate School of Engineering, Nagoya University, Department of Ecosystem Engineering, Graduate School of Engineering, The University of Tokushima, Elsevier Science Ltd, Electrochimica Acta 47 (2001) 103-107.

A. Pagani et al., Patterned Metallized Films: State-of-the-art and Growth Opportunities, Society of Vacuum Coaters, 50th Annual Technical Conference Proceedings (2007) ISSN 0737-5921.

International Search Report—PCT/NL2011/050100—Date of mailing: May 23, 2011.

International Search Report PCT/NL2011/050138—Mailing date: May 6, 2011.

International Search Report, Application No. PCT/NL2010/050491, dated Oct. 15, 2010.

European Search Report, Application No. EP07120262, dated Apr. 15, 2008.

International Search Report, Application No. PCT/NL2008/050712, dated Feb. 4, 2009.

International Search Report, Application No. PCT/NL2011/050128, dated Mar. 23, 2011.

International Search Report, Application No. PCT/NL2009/050755, dated May 25, 2010.

International Search Report, Application No. PCT/NL2009/050511, dated Oct. 14, 2009.

International Search Report, Application No. PCT/NL2011/050693, dated Nov. 7, 2011.

International Search Report—PCT/NL2011/050138—Mailing date: May 6, 2011.

International Search Report—PCT/NL2011/050693—Mailing date: Jul. 11, 2011.

* cited by examiner

A                    B

A

B

APPARATUS AND METHOD FOR REACTIVE ION ETCHING

CROSS-REFERENCE TO RELATED APPLICATIONS

This application is a U.S. National Stage application under 35 U.S.C. §371 of International Application PCT/NL2011/050138 (published as WO 2011/105908 A1), filed Feb. 25, 2011, which claims priority to Application EP 10154955.8, filed Feb. 26, 2010 and Application EP 10155103.4, filed Mar. 1, 2010. Benefit of the filing date of each of these prior applications is hereby claimed. Each of these prior applications is hereby incorporated by reference in its entirety.

FIELD OF THE INVENTION

The invention relates to an apparatus for reactive ion etching of a substrate. The invention further relates to a method for (deep) reactive ion etching of a substrate.

BACKGROUND

Today's workhorse in deep reactive ion etching (DRIE) of high aspect ratio features in silicon is the so-called Bosch process described inter alia in U.S. Pat. No. 5,498,312. This process is the most popular choice of technology in silicon micromachining and serves the huge emerging markets of
1) Through-Silicon Vias (TSVs) for 3D stacking of wafers and dies, and
2) Micro-Electromechanical Systems (MEMS, i.e. sensors and actuators), as well as more mature markets in
3) DRAM trench etching, and Shallow Trench Isolation etching.

The Bosch process is also referred to as Deep Reactive Ion Etching, which is essentially a process of subsequently etching and passivation. Originally, the Bosch process is based on alternating cycles of Si-etching with $SF_6$ or $NF_3$ in Ar to form gaseous SiFx etch products, and passivation with $CHF_3$ or $CF_4$ in Ar to form a protecting fluorocarbon polymer deposit on the sidewalls and bottom of the feature. Time scales of etch and passivation cycles are typically with cycles of several (e.g.) 3-5 seconds.

SUMMARY

According to an aspect, an etching process and apparatus is contemplated, which aims to provide a swift etching process wherein materials are efficiently used and alternative forms of passivation can be made possible.

In one aspect an apparatus for reactive ion etching of a substrate, is provided comprising: a plasma etch zone including an etch gas supply and arranged with a plasma generating structure for igniting a plasma and further comprising an electrode structure arranged to accelerate the etch plasma toward a substrate portion to have ions impinge on the surface of the substrate; a passivation zone including a cavity provided with a passivation gas supply; said supply arranged for providing a passivation gas flow from the supply to the cavity; the cavity in use being bounded by the injector head and the substrate surface; and a gas purge structure comprising a gas exhaust arranged between said etch zone and passivation zone; the gas purge structure thus forming a spatial division of the etch and passivation zones.

According to another aspect, the invention provides a method for reactive ion etching on a surface of a substrate using an apparatus including an injector head, the injector head comprising a plasma etch zone including an etch gas supply and arranged with a plasma generating structure for igniting a plasma; a passivation zone including a cavity provided with a passivation gas supply; said supply and drain arranged for providing a passivation gas flow from the supply via the cavity to the drain; the cavity in use being bounded by the injector head and the substrate surface gas; and a gas purge structure comprising a gas exhaust arranged between said etch zone and passivation zones; the gas purge structure thus forming a spatial division of the etch and passivation zones; said method while keeping said etch zones and said passivation zones spatially divided, comprising time-cycled steps of:
a) placing the injector's head plasma etch zone above a substrate portion, said substrate portion having a sub portion sensitive to an etch plasma;
b) supplying an etch plasma and accelerating the etch plasma by an electrode structure toward the substrate portion to have ions impinge on the surface of the substrate for etching the sub portions;
c) moving the injector head relative to the substrate, to position the passivation zone above the substrate portion; and
d) supplying a passivation layer on the substrate portion, by providing passivation gas in the cavity from the passivation gas supply.

Through the spatial division the etch rate can be increased considerably by eliminating gas switching and purge/pump times cycles.

The apparatus may include a cavity pressure controller. The pressure in the cavity may be controlled to be independent of, and/or different from, a pressure outside the cavity. In this way, a predetermined pressure in the cavity can be set, preferably dedicated to optimizing a mean free path of diffusion of process gases in a respective cavity dedicated to a respective process step, and optimizing a lateral flow velocity towards the substrate of the process gases.

In use of the apparatus, the cavity is bounded by the substrate surface. It may be clear that in this way the substrate helps confining the process gases. A combination of relative motion between the cavity and the substrate in the plane of the substrate surface, and confining the injected process gas to the cavity, further enables a rather efficient use of the process gas. In this way, a volume of the process gas can be distributed efficiently over the substrate surface, thus enhancing a probability of a process gas molecule to attach to the substrate surface after it is injected in the cavity.

BRIEF DESCRIPTION OF THE DRAWINGS

The invention will now be described, in a non-limiting way, with reference to the accompanying drawings, in which.

Unless stated otherwise, the same reference numbers refer to like components throughout the drawings.

DETAILED DESCRIPTION

Figure 1:
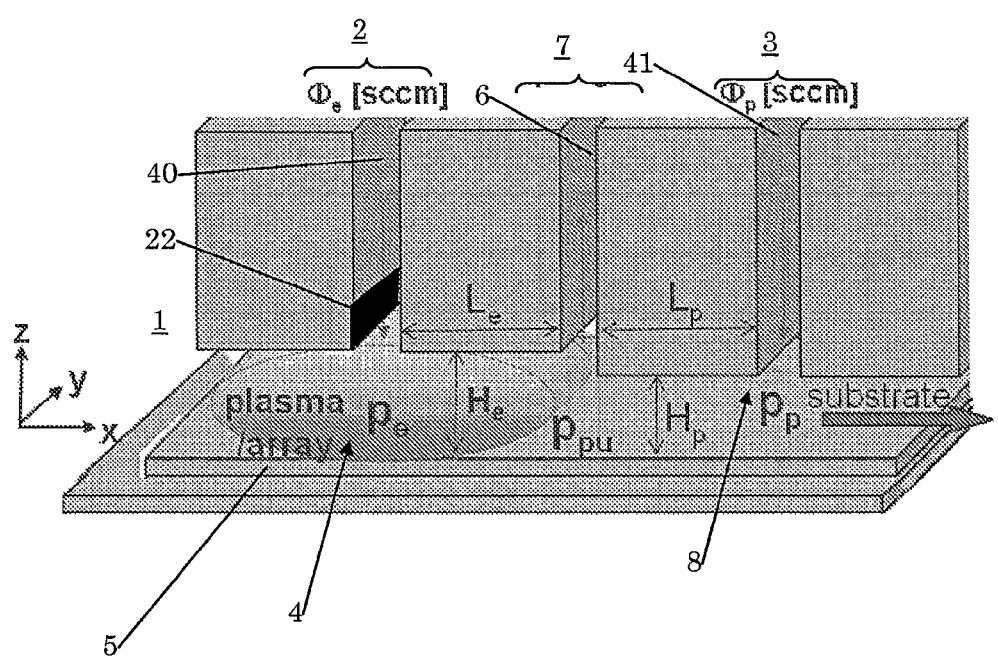
FIG. 1 shows in a first embodiment a schematic perspective side view of an apparatus for reactive ion etching of a substrate.

FIG. 1 shows in an embodiment a schematic perspective side view of an apparatus for reactive ion etching of a substrate 5. The figure shows some first-principles design considerations in terms of the preferred heights $H_e$, $H_p$ of the other gas inlet cavities (or 'pockets'), the lateral forward extensions L for the confined plasma etching zone and passivation zone, and the pressure and flow ranges. The main consideration here is that the pressure drop over a channel is proportional to cubic height $H^3$, (and linear in L and flow rate), H is a convenient design parameter to obtain the desired pressures.

It is shown that the design contains essentially a plasma etch zone and a passivation zone optionally separated by a purge gas restriction. The passivation zone in its simplest form could be conventional $C_4F_8$-based deposition.

Accordingly, an apparatus 1 for reactive ion etching of a substrate 5, is shown comprising: a plasma etch zone 2 including an etch gas supply 40 and arranged with a plasma generating structure 22 (see FIG. 2) for igniting a plasma 4. The plasma can be of a remote type, known in the art. The plasma generating structure 22 may comprise electrodes and/or an RF-coil known in the art, arranged near the cavity 20, for example, in the etch gas supply 40. In addition, the plasma generating structure 22 comprises an electrode structure (see FIG. 2) to accelerate the etch plasma towards a substrate portion to have ions impinge on the surface of the substrate. A passivation zone 3 includes a cavity 8 provided with an (optionally plasma assisted) passivation gas supply 41; said supply 41 arranged for providing a passivation gas flow from the supply 41 via the cavity 8 to drain 6; the cavity 8 in use being bounded by the injector head 1 and the substrate surface 50; and a gas purge structure 7 comprising a gas exhaust 6 arranged between said etch zone 2 and passivation zone 3; the gas purge structure 6 thus forming a spatial division of the etch and passivation zones 2 and 3.

Typically and preferably reaction steps (etching, passivation, optional purging) are carried out at room temperature, whereas optimum pressures (realized by the gas flows and dimensions of the pressures $P_e$ and $P_p$ in the reaction compartments) are provided by way of example as follows:

| Pressures (Pascal, Pa): | Flow rates (standard cubic centimeters per minute, sccm): | Dimensions (mm): |
|---|---|---|
| $P_e$ = 5-50 Pa preferably $P_e$~13 Pa | $_e$ = 50-500 sccm preferably $_e$~150 sccm | $L_e$ = 3-10 mm preferably $L_e$~5 mm |
| $P_p$ = 100-500 Pa preferably $P_p$~133 Pa | $_p$ = 50-500 sccm preferably $_p$~250 sccm | $L_p$ = 3-10 mm Preferably $L_p$~5 mm |

-continued

| Pressures (Pascal, Pa): | Flow rates (standard cubic centimeters per minute, sccm): | Dimensions (mm): |
|---|---|---|
| $P_{pu}$ = 5-50 Pa preferably $P_{pu}$~12 Pa $\Delta P_e = P_e - P_{pu}$ = 0.5-5 Pa preferably $\Delta P_e$~1 Pa $\Delta P_p = P_p - P_{pu}$ = 100-500 Pa | $_g$ = 500-3000 sccm | $H_e$ = 3-10 mm preferably $H_e$~5 mm $H_p$ = 0.3-3 mm preferably $H_p$~0.7 mm |

Figure 2:
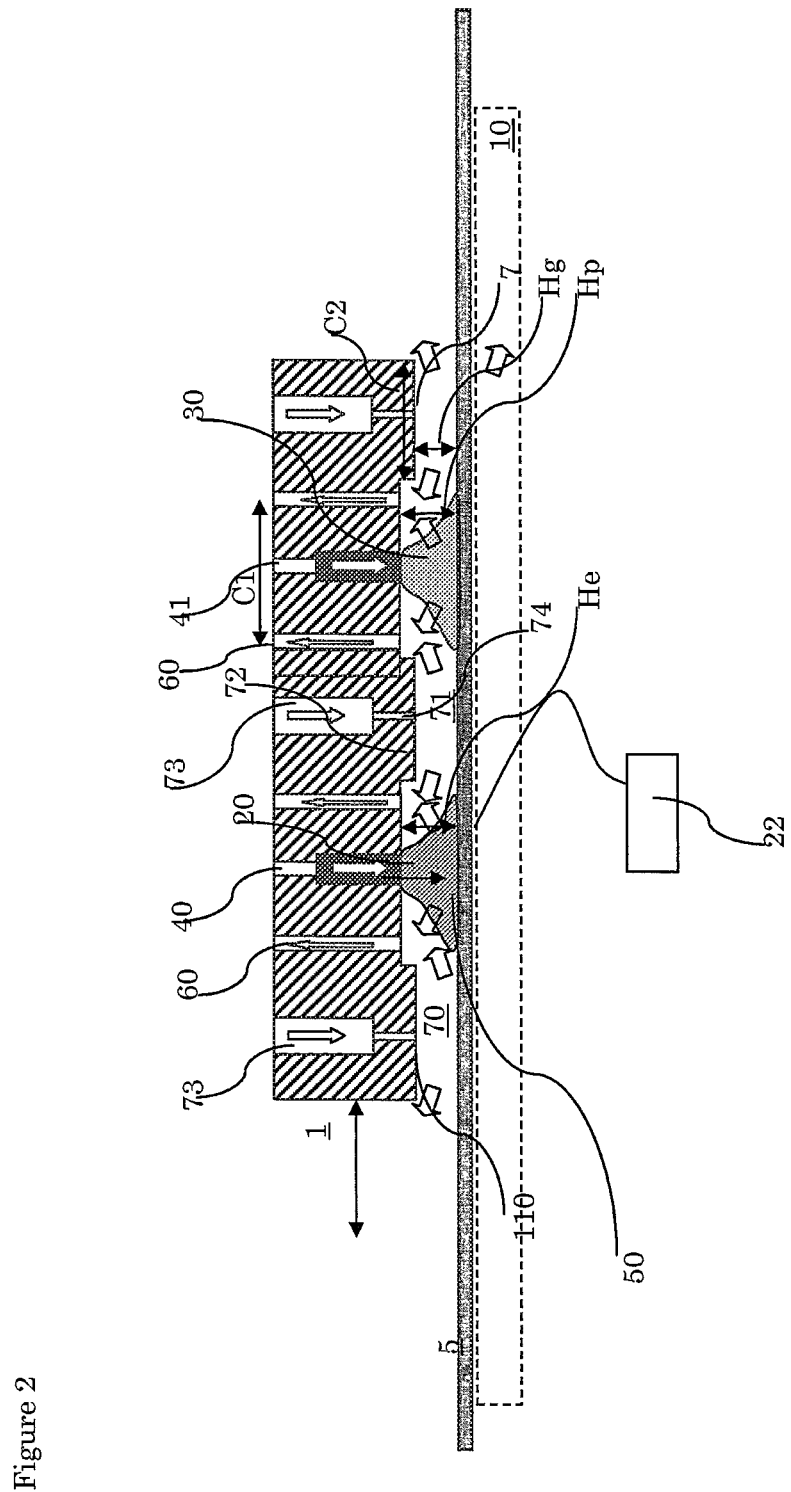
FIG. 2 shows in a second embodiment a schematic side view of an apparatus for reactive ion etching of a substrate.

FIG. 2 shows a schematic side view of an embodiment according to the invention. As an example, injector head 1 is shown having two deposition cavities 20, 30 separated by a gas bearing region 70. The passivation step may need involvement of material deposition. Such material deposition may be carried out in a cavity 30 provided with a passivation gas supply 41. Accordingly, in this embodiment it is shown that injector head comprises a cavity 30 provided with a passivation supply 41, the cavity 30 in use being bounded by gas bearing 70. Etch gas supply 40 is preferably designed without substantial flow restrictions to allow for plasma deposition. Thus, towards a substrate surface 50, plasma flow is unhindered by any flow restrictions.

In this embodiment, a process gas is fed into in the cavity 20 with a flow alongside the substrate surface 50. The gas flow is provided from the etch gas supply 40 via the cavity 20 to drain 60. In use the cavity 20 is bounded by the injector head 1 and the substrate surface 50. Gas bearings 70 are provided with a bearing gas injector 73 arranged adjacent to the cavity 20, for injecting a bearing gas between the injector head 1 and the substrate surface 50, the bearing gas thus forming a gas-bearing while confining the injected process gas to the cavity 20. The drain 60 may additionally function to drain bearing gas preventing flow of bearing gas into the cavity 20, 30.

While the embodiment shows cavities 20, 30 having equal heights, according to an aspect, preferably, the plasma etch zone includes an etch cavity 20 having a cavity height $H_e$ relative to a substrate surface 50 that is larger than a cavity height $H_p$ relative to a substrate surface 50 in the passivation zone 30.

While in the embodiment each flow barrier is dimensioned as a gas bearing 70, in principle, this is not necessary; for example, a flow barrier 71 separating the deposition cavities 20, 30 need not be dimensioned as a gas bearing as long as an effective flow barrier is provided. Typically, a flow barrier 71 may have a gap height that is larger than a gap height wherein a gas bearing 70 is effective. In practical examples, the gas bearing operates in gap height ranges from 5-100 micrometer; wherein a flow barrier may still be effective above such values, for example, until 500 micrometer. Also, gas bearings 70 may only be effective as flow barrier (or gas bearing for that matter) in the presence of substrate 5; while flow barriers may or may not be designed to be active irrespective of the presence of substrate 5. Importantly, flow of active materials between deposition cavities 20, 30 is prevented by flow barriers at any time to avoid contamination. These flow barriers may or may not be designed as gas bearings 70.

While FIG. 2 not specifically shows a conveying system, the substrate 5 can be moved relative to the injector head 1, to receive subsequent process steps in cavities 20 and 3. By reciprocating motion of the substrate 5 relative to the injector head 1, the number of process steps can be controlled. Accordingly, the injector head may be movable in plane, as well as towards and away from the conveying plane.

In particular, by moving or reciprocating the substrate holder (i.e. a chuck which can be biased to a certain voltage) under a multitude of zones for etch/passivation/etch/passivation/etc. the features in substrate or wafer 5 as they have been defined by a hard mask design commonly known to the skilled person may be etched, for example, an $SiO_2$ layer. The motion of the substrate e.g. wafer 5 can be either in one or more longitudinal traverse trajects, crossing over many repeated parallel etch (20/passivation (30) zones, or in a reciprocating motion P, Q, i.e. back and forth under one etch and one passivation zone (see FIG. 9). This way one ensures highly uniform etching results.

A support part 10 is provided that provides a support for substrate 5. The support part 10 is arranged opposite the injector head. While the support may be of a floating type, an electrode device 22 is arranged to accelerate the etch plasma toward a substrate portion to have ions impinge on the surface 50 of the substrate 5. For example, this can be done by biasing the substrate 5 in the etch process step. By absence of any mechanical support, a risk of contamination of such support is prevented which is very effective in securing optimal working height of the injector head 1 relative to the substrate 5. In addition, less down-time of the system is necessary for cleaning purposes. On the other hand, thermal/mechanical contact with the support is of advantage for an exothermal etching process, for example of the type $SF_6+Si \rightarrow SiF_4 \uparrow +SF_2$. By absence of a mechanical support, a heat capacity of the system can be reduced, resulting in faster heating response of substrates to production temperatures, which may significantly increase production throughput.

In this respect, the etch cavity 20 defines a cavity height $H_e$ relative to a substrate surface arranged for molecular/transitional flow conditions and comprises a supply 40 and drain 60 The gas bearing 71, functioning as flow barrier, comprises a bearing gas injector 73 is arranged in a bearing face 72 part facing the substrate 5, the bearing face 72 part defining, relative to the substrate, a gap distance $H_g$ which is smaller than the cavity height $H_p$.

Furthermore, the bearing gas injector 73 comprises a flow restriction 74 defining the gas bearing's mechanical stiffness. The bearing face 72 may be formed by projecting portions 110 including bearing gas injector 73. The gas-bearing layer in use is for example formed between the surface 50 and the gas bearing face 72. A distance C1 between the drains 60 may typically be in a range from 1 to 10 millimeter, which is also a typical width of the cavity 2, 3. A typical thickness of the gas-bearing layer, indicated by $H_g$, may be in a range from 3 to 15 micrometer. A typical width C2 of the projecting portion 110 may be in a range from 1 to 30 millimeter. A typical thickness $H_e$ of the etch cavity 20 out of the plane of the substrate 5 may be in a range from 3 to 10 millimeter, preferably 5 millimeter.

It will thus be appreciated that the thickness $H_g$ of the gas-bearing layer 7 may in general be less than a thickness $H_e$ of the cavity 20, measured in a plane out of the substrate surface 50.

Accordingly, in use, the total gas pressure in the cavity 20 may be different from a total gas pressure in the additional cavity 30. The total gas pressure in the etch cavity 20 may be in the molecular/transitional flow regime (in a range from 5-50 Pa, preferably ~13 Pa) and/or the total gas pressure in the passivation cavity 30 may be in the continuous flow regime (in a range from 50-500 Pa, preferably ~133 Pa). Such pressure values may be chosen based on actual properties of the passivation gas, actual flow rates and actual dimensions.

A pressure controller (not shown) may control a cavity pressure for controlling the pressure in cavities 20, 30. In addition, the controller controls gas-bearing layer pressure in the gas-bearing layer 70.

Figure 3:
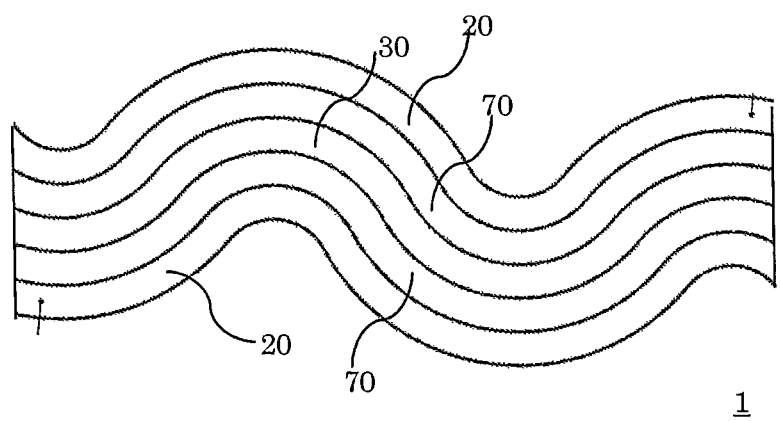
FIG. 3 shows a bottom view of an injector head according to another embodiment of the invention.

FIG. 3 shows a schematic example of an undulate shape for the injector head 1 seen in a direction normal to the substrate surface. Typically, the curved shape may prevent first order bending modes of the substrate 2. Accordingly, it can be seen that the gas bearing 70, and cavities 20 and 30 are formed, seen in a direction normal to the substrate surface as undulated shapes to prevent first order bending modes of the sheet substrate. In addition, typically, the shape of deposition cavities 20, 30 may follow the shape of the gas bearing slits 70 to allow for a compact injector head construction. These variations allow for optimization of a pressure distribution on the substrate surface. Such optimization can be important for fragile or flexible substrates.

Figure 4:
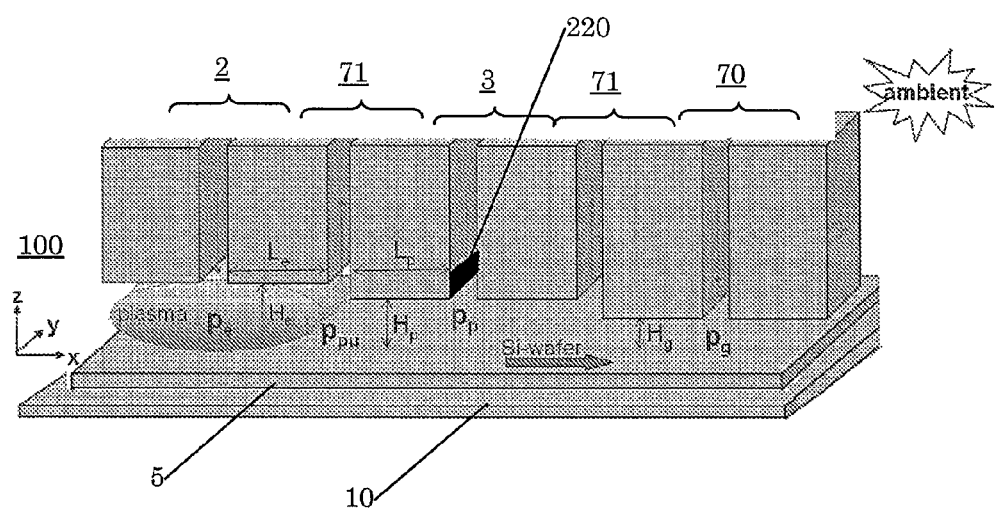
FIG. 4 shows yet another schematic perspective side view of an apparatus for reactive ion etching of a substrate.

FIG. 4 shows yet another schematic perspective side view of an apparatus 100 for reactive ion etching of a substrate 5 having a $C_4F_8$ wall passivation subcycle in passivation zone 3. In the example, a plasma generating structure 220 is provided to provide a passivation gas plasma. This structure may comprise electrodes and/or an RF-coil known in the art to generate a suitable passivation gas plasma. Throughout the description (the use of) passivation gases or passivation plasmas are considered equivalent as the case may be. A support part 10 is provided that provides a support for substrate 5. The process in general will be faster when increasing the pressure, especially for the passivation step since it will take significantly more time to deliver/etch sufficient molecules for the passivation inside a feature with its side wall area and bottom area fully covered than to deliver energetic and etching species to open up and further etch the bottom part of the feature.

1. The Langmuir etch time increases proportional to A (only for the bottom of the etched feature, i.e. by a factor of $\{3/4 \cdot A+1\}$), with A being the feature depth-to-width aspect ratio 2. The Langmuir deposition time increases proportional to A squared, $A^2$ (for the bottom and the side walls of the etched feature, i.e. by a factor of $\{3/2 \cdot A^2+19/4 \cdot A+1\}$)

However, for the etch step in etching zone 2, at higher pressure, the increased level of inter-molecular collisions will lead to deteriorated uni-directional etch properties. Therefore, the etch step should be performed at low pressure in a molecular/transitional flow regime, at 0.1-1.0 Torr (~0.1-1 mbar or 10-100 Pa) more preferably in the range from 10-100 Pa (~0.1-1 Torr). These low pressures are required because inter-molecular collisions should be avoided as much as possible enabling directional etch ('line-of-sight').

For the passivation step in zone 3, it is very beneficial to increase the pressure towards continuous flow conditions, e.g. in the range from 100 Pa to 1000 Pa (~1-10 Torr), and keeping the flow rates the same, as the Langmuir timescale for deposition is reduced by a factor of 10. Further increase of pressure does not lead to decreased deposition time as deposition then becomes supply-limited. For a CVD-based passivation step at higher pressure, non-uniformity of the coating in the features is a risk (especially at high A): due to the increased sticking probability, precursor will be depleted near the mouth of the feature, leaving the bottom of the feature uncoated. The purge areas 71 may be formed as gas bearings; at least an outer perimeter is formed by gas bearing 70.

Figure 5:
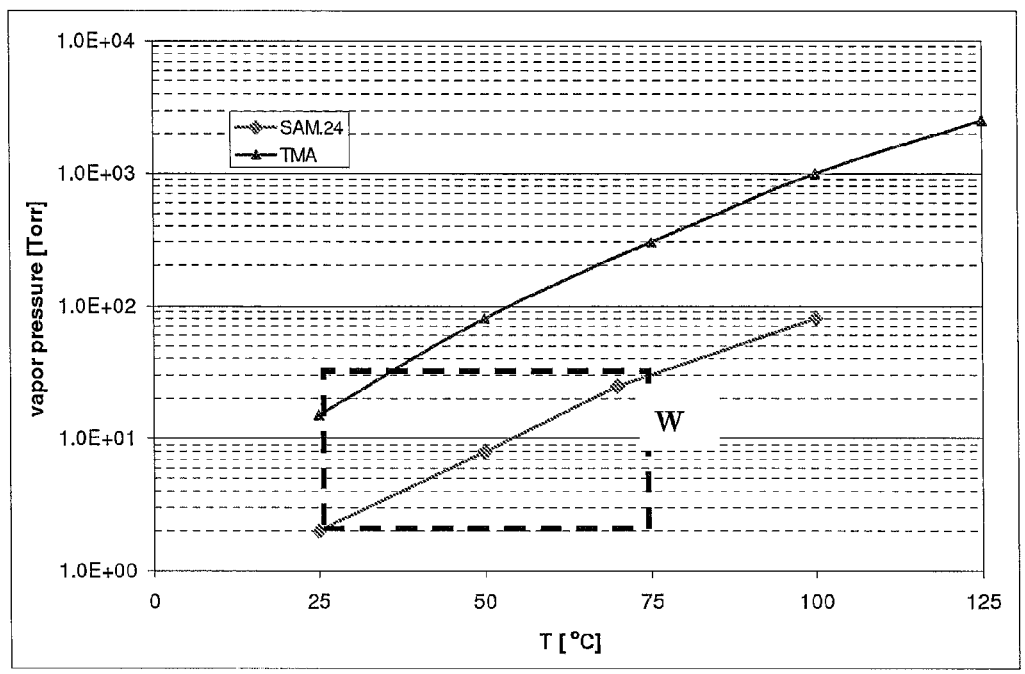
FIG. 5 shows an illustrative chart with a process window W.

FIG. 5 shows an illustrative chart with a process window W of suitable pressures and operating temperatures for a silicon precursor H2Si[N(C2H5)2]2 known as SAM.24. Although this precursor has a vapor pressure typically ~10× lower than a conventional aluminum precursor known as TMA the vapor pressure is in a suitable high pressure regime for passivation. For a temperature range of 25-75° C. a partial pressure of the SAM.24 is in the range of 0.1-10 Torr.

Figure 6:
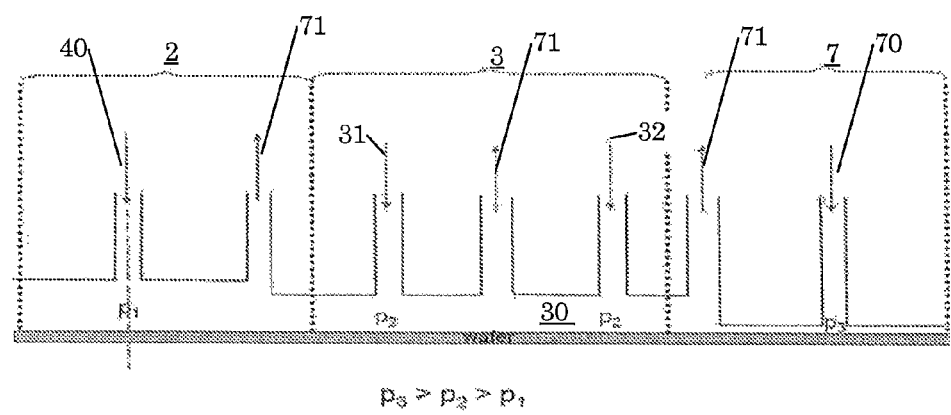
FIG. 6 shows a further schematic side view of another embodiment.

FIG. 6 shows a further schematic side view of another embodiment wherein a passivation step of an Atomic Layer Deposition (ALD) type is provided, having an ALD-based $SiO_2$ passivation, preferably at room temperature. It is noted that ALD process gases are environmentally friendly compared to a conventional $C_4F_8$ passivation step. Accordingly, the passivation zone comprises a multiple of supplies 31, 32, at least one supply 31 arranged for supplying a precursor gas in an atomic layer deposition process; and a further supply provided with a reactant supply 32, the further supply in use being bounded by a flow barrier. While the figures schematically shows the supplies arranged in a single cavity 30; typically, each supply 31, 32 may be comprised, with a respective drain, in a respective cavity, bounded by a flow barrier 71 and/or gas bearing 70 thus confining said cavity. Other ALD passivation materials and cycling schemes are viable also, such as $Al_2O_3$, etc. An extension to plasma enhancement (e.g. with a remote ICP plasma source) is also possible here. ALD does not have the drawback of non-conformal growth near the mouth of the features, as, due to the inherent self-limiting nature of the ALD process, the coating proceeds from the mouth of the feature towards the bottom of the feature. Thus, ALD opens up the possibility of increasing the pressure and layer growth rate. ALD is able to meet the requirements for high growth rate atomic layer-by-layer control and thus step-conformal deposition using sequential, self-limiting surface reactions.

Most ALD processes are based on binary reaction sequences where two surface reactions occur and deposit a binary compound film. Because there are only a finite number of surface sites, the reactions can only deposit a finite number of surface species. If each of the two surface reactions is self-limiting, then the two reactions may proceed in a sequential fashion to deposit a thin film with atomic level control.

The advantages of ALD are precise thickness control at the Ångstrom or monolayer level. The self-limiting aspect of ALD leads to excellent step coverage and conformal deposition on high aspect ratio structures.

An effective binary compound film for passivation can be an $SiO_2$ layer that with ALD, in particular plasma assisted ALD, can even be deposited at moderate temperatures, down to room temperature, using specific organometallic Si-precursors in combination with an oxygen precursor, or plasma oxygen. $SiO_2$ is the preferred choice of hard mask material applied on the 2D-surface of Si-wafers. It is a very effective mask material with etch rate selectivity S ($SiO_2$/Si)>80:1 up to 200:1.

As in ALD only one monolayer (or even less) is deposited, for proper passivation properties, multiple ALD steps (order of 10) might be required to obtain one layer, or a few (e.g. up to ~5) nanometers.

Possibly, with a proper design of the reactive ion etching system (the example with different nozzle-to-substrate dimensions and different pressures with $p_3>p_2>p_1$ is outlined in the figure), the etch step can be operated at a 10-100 times lower pressure than the passivation step(s). To allow the operation of the total unit in atmospheric ambient, the etching and passivation segments 2, 3 should be surrounded by an ambient guarding zone 7 with a gap height of the order of 100 micrometer. It is noted that an addition of about 10% oxygen ($O_2$) from the ambient atmosphere is permitted in case of an $SF_6$ etching gas which advantageously may prevent clogging of drain lines. The $O_2$ may be added via the gas bearing supply, via leak or intentional addition.

Figure 7:
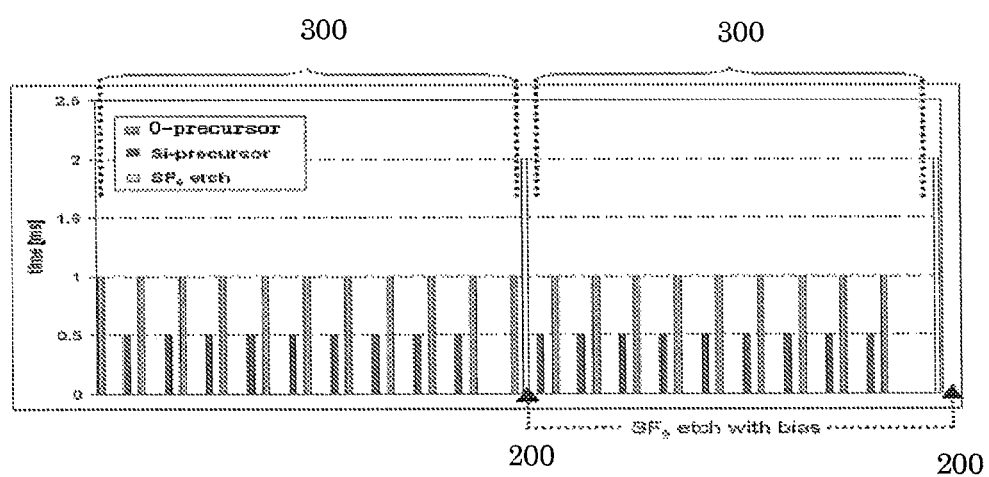
FIG. 7 shows a schematic time chart of ALD passivation cycles, nested in between etching subcycles.

FIG. 7 shows a schematic time chart of ALD passivation cycles 300, nested in between etching subcycles 200. In the passivation step 300, $SiO_2$ ALD deposition is provided by passivation cycles of an O-precursor (H2O, O3 or O2 plasma and a Si precursor (e.g. aminosilanes) while preferably balancing out the electrode bias of the substrate by a counter bias voltage arranged by a counter bias electrode in the passivation cavity. In etch step 200, a bias is provided to accelerate the etch plasma 4 toward the substrate portion to have ions impinge on the surface of the substrate for etching the sub portions. Other oxides may include germanium oxide or tungsten oxide, preferably of a type that is volatile in a fluorine environment.

It is noted that anisotropic, high aspect ratio etch profiles are obtained by the introduction of a directional effect in the etch step 200, which can be provided by a combination of a compact (micro) plasma array source with substrate biasing. This may be accomplished by setting a voltage bias (DC or RF) on a conductive substrate holder 10. This will generate a voltage on the entire substrate such that ions are extracted from the $SF_6$ plasma zone. These ions will preferentially etch off the passivation layer at the trench bottom, and sustain the directional etching. The bias voltage has considerably less effect on the wafer parts in the $C_4F_8$ passivation zone(s) where reagent gas pressure in the plasma is higher, or in the ALD $SiO_2$ passivation zone(s), where gas pressure is similar in the plasma mode or higher in pure thermal mode, thus suppressing most of the directionality. Alternatively or additionally a local bias on the passivation cavities may be set, e.g. by a counter bias electrode arranged in the cavity, such to balance out a pre-set bias on the global substrate chuck which is optimum to sustain the directionality of ions created in the etch cavities of the injector head.

Figure 8:
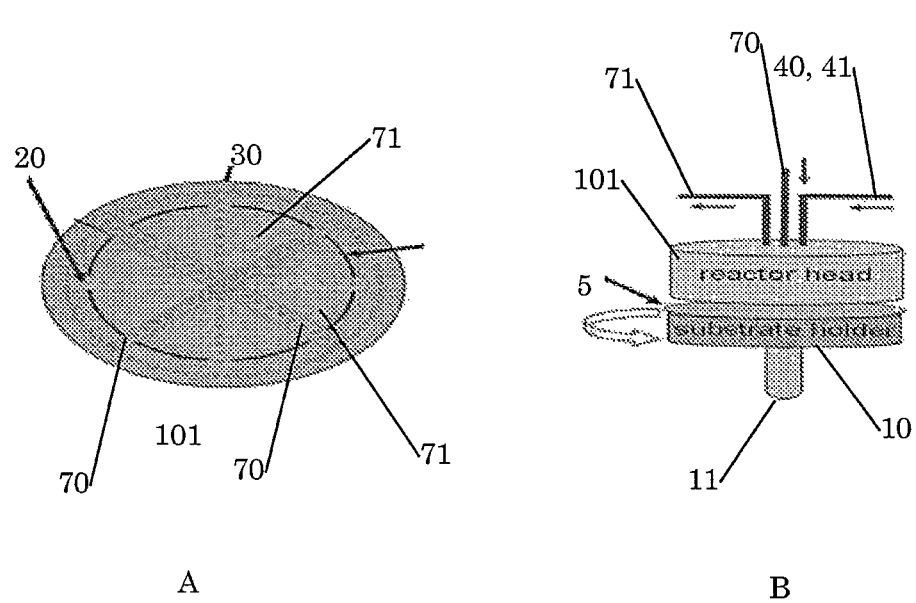
FIG. 8 shows an alternative embodiment including a rotating injector head.

FIG. 8 shows an alternative embodiment including a rotating injector head 101. FIG. 8A shows a bottom side of the spatial RIE reactor head, where the $SF_6$ zones 20 and $C_4F_8$ zones 30 are integrated into inlets surrounded by exhaust zones 71 and gas bearing planes 70. Here, the wafer 5 may be clamped onto a substrate holder 10 that rotates on shaft 11 underneath the reactor head 101 that contains cavities with inlets 40,41 for the $SF_6$ plasma etching and $C_4F_8$ (or $SiO_2$ ALD) passivation gases, and for the gas bearing (e.g. $N_2$) outlets 70, 71. Note, that the actual speed with which the wafer 5 passes underneath the reaction zones 20, 30 varies radially over the wafer 5, with higher speeds further away from the centre of the wafer 5 and, consequently, shorter exposure times. With equal size and shape of the gas outlets, this would result in an inhomogeneous gas dosing across the entire wafer 5 with shallower trenches further away from the wafer center. This may be compensated by varying an outlet density or by inserting larger outlet diameters further towards the wafer edge, such that homogeneous gas dosing is achieved. The wafer biasing may be carried out by DC or RF biasing of the conductive substrate table. The substrate holder 10 is rotated by a servo motor, connected by a drive shaft. The process- and waste gas lines 40, 41, 70, 71 are connected to the reactor head 101 by an opening through the top of the oven. The substrate biasing can be continuous.

Figure 9:
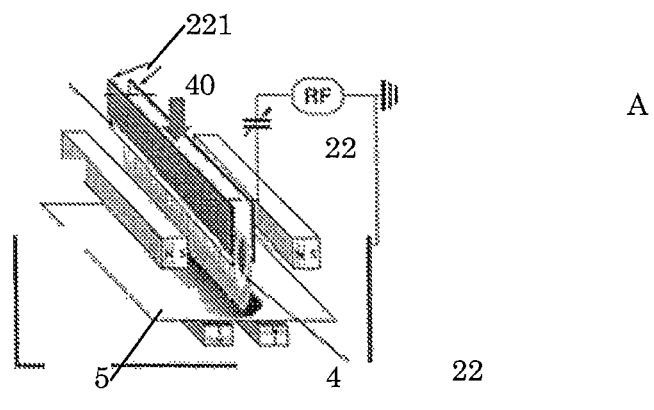
FIG. 9 shows a number of electrode configurations for providing a plasma.
Figure 9:
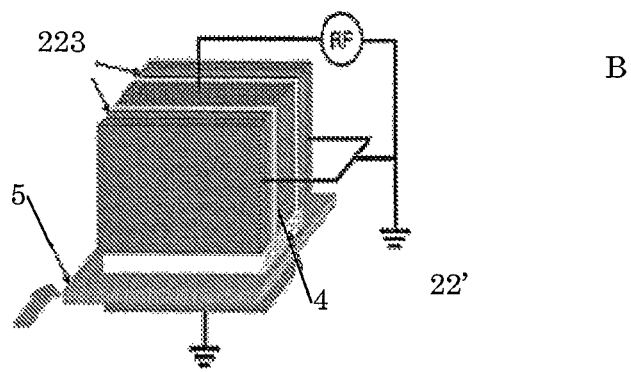

FIG. 9 shows a number of electrode configurations suitable for providing a plasma. For example an array of high-density (~10^13 species/$cm^3$) plasma or microplasma sources may be provided having microscale plasmas in a micrometer to [sub]millimeter range, forming a quasi-linear source of flowing gas plasma, or a longitudinal plasma source (remote ICP plasma, microwave) over these lengths, with some extra margin.

By virtue of their small dimensions (submillimeter) such micro plasmas can generally operate at higher pressures, and exhibit characteristics that differ from traditional plasmas at lower pressure regions. Thus higher plasma densities (>10^13 species/cm$^3$) may be possible as well, provided the dimensions are reduced in coherence with the mean free path of the gas species.

As an example shown in FIG. 9A, a plasma generating structure 22 in the form of hollow cathode discharge is known to produce a linear arc plasma 4 from etch gas supply 40 of high density with such length on a substrate 5, in the figure held between magnets N/S. Typically a linear arc discharge (LAD) is shown based on an RF-generated hollow cathode discharge between two parallel plates 221. The plasma source 22 can be incorporated in (or integrated by micromachining) with the etching zone 20 of the injector head 1 (see FIG. 1). In principle the plasma source 22 extends over a semiconductor substrate 5 for the typical lateral dimensions of $L_e \geq 5$ millimeter (x-direction in FIG. 9), and a height H≥5 millimeter. A typical width could be chosen so that a homogeneous plasma intensity is obtained over the entire wafer size, so minimally the standard of 300 to 450 millimeter in regular semiconductor processing and ≥156 millimeter in solar cell processing, but more typically some oversizing up to 1 meter, or more.

FIG. 9B shows another embodiment 22' containing dielectric barrier plasma sources, particular barrier plasma source operated at 13.56 MHz in air having dielectrics 223 generating a plasma 4 on a substrate 5. Other plasma sources 22 such as slot antenna (SLAN)-sources can be used as may be known to those skilled in the art. Preferably the so-called dark space between the plasma and the substrate is large enough (at least a few 100 micrometer) so as to sufficiently extract and accelerate the ions from the plasma 4 to the substrate surface 5.

Figure 10:
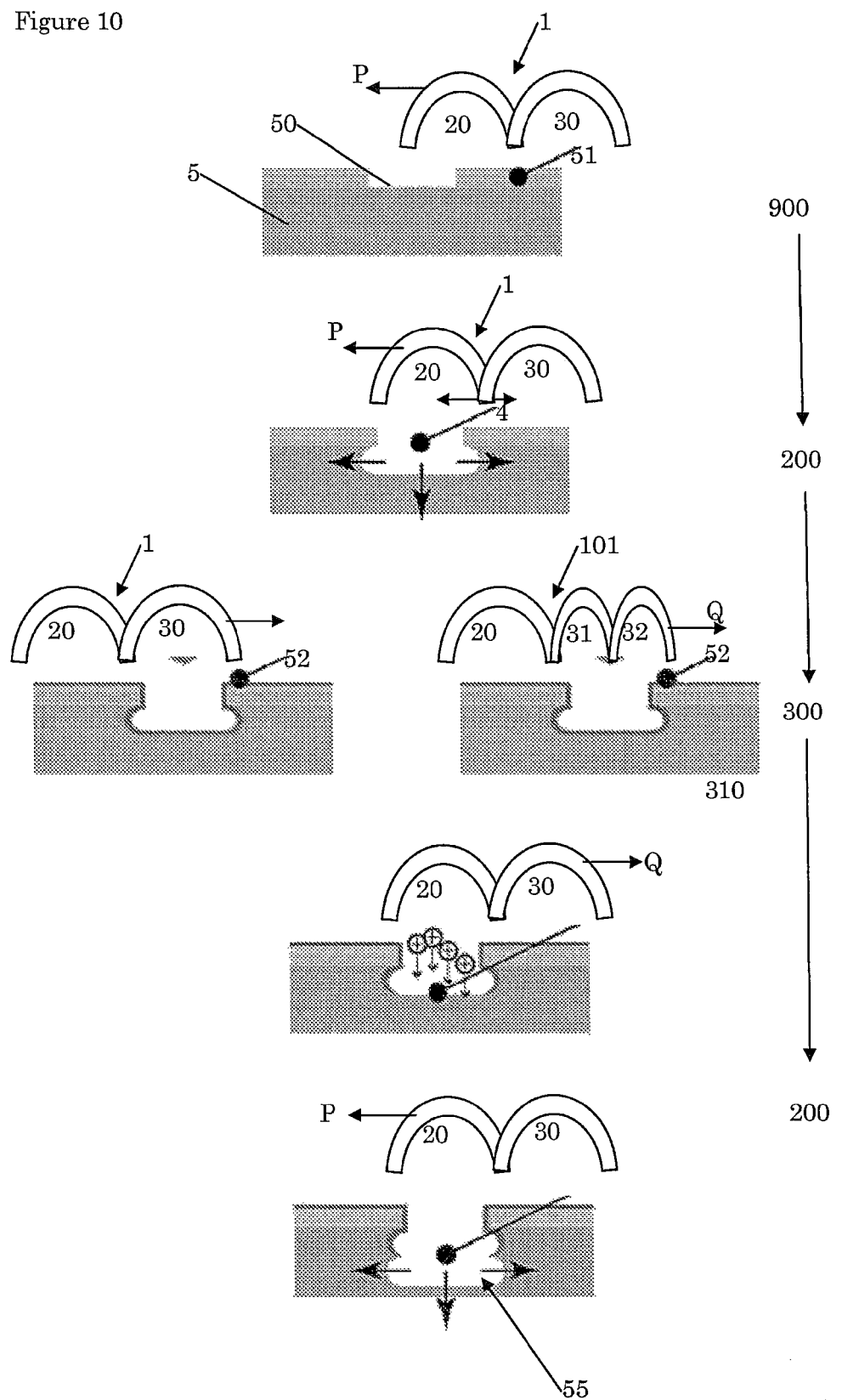
FIG. 10 schematically shows the etching/passivation process with an alternative ALD passivation.

FIG. 10 schematically shows the etching/passivation 200/300 process with injector head 1 as herein disclosed with an alternatively an ALD passivation step 310 using an ALD printhead 101 having cavities 31 32 as previously described. In a first step 900 a substrate 5 is provided having sub portions 50 sensitive to a plasma, and a photoresist or patterned hard mask portion 51 protecting remainder of the substrate 5.

Etching step 200 with SF$_6$ is substantially isotropic. Without interruption it would proceed mainly by the non-directional neutral species (F-containing radicals). In order to minimize this lateral etching component the etch steps are quickly interrupted by the next wall passivation step 300. During each etch step a bias voltage is applied to the substrate chuck 5. This causes a directional physical ion bombardment from the plasma onto the substrate 5 that breaks down the polymer only at the bottom part of the feature, thus enabling the deep feature etching. The process enables dry-etching of deep vertical microstructures 55 in silicon with relatively high etch rates and selectivities (up to ~200:1) against a hard oxide (usually SiO$_2$) mask and/or photoresist mask material. Accordingly the method comprises time cycled steps of e) placing (step 900) the injector's head 1 plasma etch zone 20 above a substrate portion 5, said substrate portion having a sub portions 50 sensitive to an etch plasma 4, for example, SF$_6$;

f) supplying (step 200) an etch plasma 4 and accelerating the etch plasma 4 toward the substrate portion to have ions impinge on the surface 50 of the substrate 5 for etching the sub portions;

g) moving (step 300) the injector head 1 relative to the substrate 5, to position the passivation zone 30 above the substrate portion 50; and h) supplying a passivation layer 52 on the substrate portion 50, by providing passivation gas in the cavity 30.

The time cycled steps can be executed by reciprocating motion P, Q of the injector head 1. Alternatively, this can be executed by a rotating motion of the injector head 101 as disclosed in FIG. 8.

In the alternative atomic layer passivation step 310, the passivation zone comprises a multiple of supplies 31, 32, said supplying of the passivation layer provided in an atomic layer deposition process step by supplying a precursor gas in a first cavity 31; and a reactant supply is provided in further cavity 32 provided with a reactant supply, the further cavity in use being bounded by a flow barrier. Optionally the injector head 1, 101 can be placed in gas bearing contact with the substrate by a gas bearing structure.

The gas-bearing layer in use typically shows a strong increase of the pressure in the gas-bearing layer as a result of the close approach of the injector head towards the substrate surface. For example, in use the pressure in the gas-bearing layer at least doubles, for example typically increases eight times, when the injector head moves two times closer to the substrate, for example from a position of 50 micrometer from the substrate surface to a position of 25 micrometer from the substrate surface, ceteris paribus. Preferably, a stiffness of the gas-bearing layer in use is between $10^3$ and $10^{10}$ Newton per meter, but can also be outside this range. Such elevated gas pressures may for example be in a range from 1.2 to 20 bar, in particular in a range from 3 to 8 bar. A stronger flow barrier in general leads to higher elevated pressures. An elevated process gas pressure increases a deposition speed of the process gas on the substrate surface. As deposition of the process gas often forms an important speed-limiting process step of reactive ion etching, this embodiment allows increasing of the rate of reactive ion etching.

In an embodiment, the apparatus is arranged for applying a pre-stressing force on the injector head directed towards the substrate surface along direction P. The gas injector may be arranged for counteracting the pre-stressing force by controlling the pressure in the gas-bearing layer. In use, the pre-stressing force increases a stiffness of the gas-bearing layer. Such an increased stiffness reduces unwanted movement out of the plane of the substrate surface. As a result, the injector head can be operated more closely to the substrate surface, without touching the substrate surface.

Alternatively or additionally, the pre-stressing force may be formed magnetically, and/or gravitationally by adding a weight to the injector head for creating the pre-stressing force. Alternatively or additionally, the pre-stressing force may be formed by a spring or another elastic element.

In an embodiment, the print head supplies 31, 32 are arranged for flow of the process gas in a direction transverse to a longitudinal direction of the cavity. In an embodiment, the precursor supply is formed by at least one precursor supply slit, wherein the longitudinal direction of the cavity is directed along the at least one precursor supply slit. Preferably, the injector head is arranged for flow of the process gas in a direction transverse to a longitudinal direction of the at least one precursor supply slit. This enables a concentration of the process gas to be substantially constant along the supply slit, as no concentration gradient can be established as a result of adhesion of the process gas to the substrate surface. The concentration of the process gas is preferably chosen slightly above a minimum concentration needed for reactive ion etching. This adds to efficient use of the process gas. Preferably, the relative motion between the cavity and the substrate in the plane of the substrate surface, is transverse to the longitudinal direction of the at least one precursor supply slit. Accordingly, the precursor drain is provided adjacent the precursor supply, to define a process gas flow that is aligned with a conveying direction of the substrate.

In an embodiment, the gas-bearing layer forms the confining structure, in particular the flow barrier. In this embodiment, an outer flow path may at least partly lead through the gas-bearing layer. As the gas-bearing layer forms a rather effective version of the confining structure and/or the flow barrier, loss of the process gas via the outer flow path may be prevented.

In an embodiment, the flow barrier is formed by a confining gas curtain and/or a confining gas pressure in the outer flow path. These form reliable and versatile options for forming the flow barrier. Gas that forms the confining gas curtain and/or pressure may as well form at least part of the gas-bearing layer. Alternatively or additionally, the flow barrier is formed by a fluidic structure that is attached to the injector head. Preferably, such a fluidic structure is made of a fluid that can sustain temperatures up to one of 80° C., 200° C., 400° C., and 600° C. Such fluids as such are known to the skilled person.

In an embodiment, the flow barrier is formed by a flow gap between the injector head and the substrate surface and/or between the injector head and a surface that extends from the substrate surface in the plane of the substrate surface, wherein a thickness and length of the flow gap along the outer flow path are adapted for substantially impeding the volumetric flow rate of the process gas along the outer flow path compared to the volumetric flow rate of the injected process gas. Preferably, such a flow gap at the same time forms, at least part of, the outer flow path. Preferably, a thickness of the flow gap is determined by the gas-bearing layer. Although in this embodiment a small amount of the process gas may flow out of the cavity along the outer flow path, it enables a rather uncomplicated yet effective option for forming the flow barrier.

In an embodiment, the cavities 20, 30 have an elongated shape in the plane of the substrate surface. A dimension of the cavity transverse to the substrate surface may be significantly, for example at least 5 times or at least 50 times, smaller than one or more dimensions of the cavity in the plane of the substrate surface. The elongated shape can be planar or curved. Such an elongated shape diminishes a volume of the process gas that needs to be injected in the cavity, thus enhancing the efficiency of the injected gas. It also enables a shorter time for filling and emptying the cavity, thus increasing the speed of the overall reactive ion etching process.

Suitable atomic layer deposition gasses or vapors to form the passivation layer, preferably $SiO_2$, may include for example special organometallic Si-precursors (e.g. aminosilanes such as silanediamine N,N,N',N'-tetraethyl ($H_2Si[N(C_2H_5)_2]_2$)), that preferably react at room temperature with oxygen/oxygen plasma. The process gas can be injected together with a carrier gas, such as nitrogen gas or argon gas. A concentration of the process gas in the carrier gas may typically be in a range from 0.01 to 1 volume %. In use, a process gas pressure in the cavity 14 may typically be in a range from 0.1 to 1 millibar, but can also be near atmospheric pressure, or even be significantly above atmospheric pressure. The injector head may be provided with a temperature control for establishing a temperature in the cavity preferably in a range between −20 C to +40° C. or even −20° C. to +50° C.

Suitably, the cavity walls are formed of a stainless steel, optionally provided with a ceramic coating.

The present spatial Deep Reactive Ion Etching method as described herein may enable cost-effective etching rates that may exceed current state-of-the-art by a factor of ~10. In addition, advantages of gas-bearing based reactive ion etching may include:

- Much smaller reactor chamber dimensions: less intermolecular collisions on the path from plasma to feature leading to improved unidirectional etching, and better uniformity of etched profiles and depths
- No or little passivation gas interacting during etch step and vice versa, reducing or even preventing deposits on reactor walls
- Much more stable process, much longer machine up-time and much less reactor cleaning and re-conditioning required
- Shorter pulses possible (no flushing), leading to less pronounced scallops/ripples and smoother via walls
- Higher reaction efficiency leading to cost effective chemicals usage.
- A platform for spatial processing offering the combination of etching and deposition, with possible extension/switching to accelerated processing (e.g. pulsed PECVD SiOx TSV/via coating ($SiO_2$ isolation, combined with ALD/CVD of seed/barrier [e.g. TaN, Cu] layers, etc.) in TSV process flows, or optical coatings for optical interconnects.
- Fluorine containing passivation chemicals may be omitted in case of ALD passivation (environmentally friendly)
- Options of other physical stimuli for local reagent activation integrated in the microcavities of the injector head assembly, such as lasers (VCSELs, vertical-cavity surface-emitting lasers), UV sources, etc.

Accordingly, a novel, compact gas-bearing based Deep Reactive Ion Etching (DRIE) process and apparatus for ultrafast and optionally carrier-less dry etching for cost-effective DRIE etching is disclosed of high aspect ratio features such as through-silicon via (TSV) interconnects in 3D-stacked die and wafer-level packaging technology (e.g. stacked memories, and heterogeneous 3D-stacked System-in-Package (SiP) products), and Micromechanical Systems (MEMS), but also silicon-based photovoltaic cell through-wafer interconnects.

Although it may not be explicitly indicated, any apparatus according one embodiment may have features of the apparatus in another embodiment.

The invention is not limited to any embodiment herein described and, within the purview of the skilled person, modifications are possible which may be considered within the scope of the appended claims. Equally all kinematic inversions are considered inherently disclosed and to be within the scope of the present invention. The use of expressions like: "preferably", "in particular", "typically", etc. is not intended to limit the invention. The indefinite article "a" or "an" does not exclude a plurality. Features which are not specifically or explicitly described or claimed may be additionally included in the structure according to the present invention without deviating from its scope.

The invention claimed is:

1. Apparatus for reactive ion etching of a substrate, comprising:
   an injector head comprising
   a plasma etch zone including an etch cavity having an etch cavity height $H_e$ to a substrate surface, the etch cavity being provided with an etch gas supply and arranged with a plasma generating structure for igniting a plasma and further comprising an electrode structure arranged to accelerate the etch plasma toward a first substrate portion to have ions impinge on the surface of the substrate;
   a passivation zone including a passivation cavity having a passivation cavity height $H_p$ to a substrate surface, the passivation cavity being provided with a passivation gas supply; said supply arranged for providing a passivation gas flow from the supply to the passivation cavity; the passivation cavity in use being bounded by the injector head and the substrate surface; and
   a gas purge structure comprising a gas exhaust arranged between said etch zone and passivation zone; the gas purge structure thus forming a spatial division between each of the etch and passivation zones;
   wherein said apparatus comprises cavity walls, and wherein said plasma etch zone and said passivation zone are confined by gas bearings at outer perimeters thereof,
   the apparatus further comprising a bearing gas injector arranged for providing one or more of the gas bearings, wherein the bearing gas injector is arranged in a bearing face part facing the substrate, the bearing face part defining a gap distance $H_g$ to the substrate, which is smaller than the etch cavity height $H_e$ and the passivation cavity height $H_p$; and
   a pressure controller cooperating with the bearing gas injector for controlling the pressure of the gas bearings, the pressure controller being configured to independently control a first pressure in said etch cavity and a second pressure in said passivation cavity.

2. Apparatus according to claim 1, further comprising a gas bearing structure comprising the bearing gas injector, wherein the bearing gas injector is arranged for injecting a bearing gas between the injector head and the substrate surface.

3. Apparatus according to claim 2, wherein the bearing gas injector comprises a flow restriction defining the gas bearing's mechanical stiffness.

4. Apparatus according to claim 2, wherein the gas bearing is formed, seen in a direction normal to the substrate surface as undulated shapes to prevent first order bending modes of the sheet substrate.

5. Apparatus according to claim 1, wherein the etch cavity height $H_e$ is larger than the passivation cavity height $H_p$.

6. Apparatus according to claim 1, wherein the passivation zone comprises a multiple of supplies, at least one supply arranged for supplying a precursor gas in an atomic layer deposition process step; and a further supply provided with a reactant supply, the further supply in use being bounded by a flow barrier.

7. Apparatus according to claim 6, wherein the at least one supply is provided in a respective further cavity including a drain confining the further cavity.

8. Apparatus according to claim 2, further comprising a support part arranged opposite the injector head for supporting a substrate to be held by said gas bearing structure; the support part comprising an electrode for directing the etch plasma towards the substrate.

9. Apparatus according to claim 1, wherein the injector head is movable towards and away from the conveying plane.

10. Apparatus according to claim 1, further comprising a temperature control, arranged to keep the cavity temperature of the passivation cavity in a range between −20° C. to +75° C.

11. Method for reactive ion etching on a surface of a substrate, the method comprising using the apparatus of claim 1 to perform time-cycled steps of:
   a) placing the plasma etch zone above the first substrate portion, having a sub portions sensitive to the etch plasma;
   b) supplying the etch plasma and accelerating the etch plasma by the electrode structure toward the first substrate portion to have ions impinge on the surface of the substrate for etching the sub portions;
   c) moving the injector head relative to the substrate, to position the passivation zone above the first substrate portion; and
   d) supplying a passivation layer on the substrate portion, by providing the passivation gas in the cavity from the passivation gas supply.

12. Method according to claim 11, the passivation zone comprises a multiple of supplies, said supplying of the passivation layer provided in an atomic layer deposition process step by supplying a precursor gas in a first cavity; and a reactant supply is provided in further cavity provided with a reactant supply, the further cavity in use being bounded by a flow barrier.

13. Method according to claim 11 further comprising placing the injector head in gas bearing contact with the substrate by a gas bearing structure.

14. Method according to claim 11 further comprising controlling the cavity temperature in a range between −20 C to +75° C.

15. The apparatus of claim 1, wherein the electrode structure is configured to accelerate the etch plasma toward the first substrate portion in the plasma etch zone, and wherein the passivation gas supply is configured to provide the passivation gas flow simultaneously to a second substrate portion of the substrate.

16. Apparatus according to claim 1, wherein the pressure controller is configured for controlling the first pressure and the second pressure such that the second pressure is higher than the first pressure.

* * * * *